(12) United States Patent
Kim et al.

(10) Patent No.: US 8,289,099 B2
(45) Date of Patent: Oct. 16, 2012

(54) ELECTROMAGNETIC BANDGAP STRUCTURE AND CIRCUIT BOARD

(75) Inventors: Han Kim, Yongin-si (KR); Ja-Bu Koo, Suwon-si (KR); Dae-Hyun Park, Ulsan (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 450 days.

(21) Appl. No.: 12/568,362

(22) Filed: Sep. 28, 2009

(65) Prior Publication Data

US 2010/0134213 A1    Jun. 3, 2010

(30) Foreign Application Priority Data

Dec. 2, 2008  (KR) .................. 10-2008-0120949

(51) Int. Cl.
*H03H 7/00* (2006.01)
(52) U.S. Cl. .................. 333/12; 333/167; 333/185
(58) Field of Classification Search .............. 333/12, 333/167, 185, 202, 204, 212, 246
See application file for complete search history.

(56) References Cited

U.S. PATENT DOCUMENTS

| | | | |
|---|---|---|---|
| 6,483,045 B1 * | 11/2002 | Wang et al. | 174/264 |
| 6,943,650 B2 * | 9/2005 | Ramprasad et al. | 333/202 |
| 2005/0194168 A1 * | 9/2005 | Tonomura et al. | 174/35 R |
| 2007/0090398 A1 * | 4/2007 | McKinzie, III | 257/192 |

* cited by examiner

*Primary Examiner* — Robert Pascal
*Assistant Examiner* — Kimberly Glenn
(74) *Attorney, Agent, or Firm* — McDermott Will & Emery LLP

(57) ABSTRACT

An electromagnetic bandgap structure includes: first conductive plates, placed on a first planar surface, in which the first conductive plates are lined up in a first direction; second conductive plates, placed on a second planar surface and arranged at an area corresponding to an area in which the first conductive plates are disposed, in which the second conductive plates are lined up in the first direction; a first stitching via, electrically connecting any two adjacent conductive portions with each other and in which the two adjacent conductive portions are lined up in a direction that is different from the first direction on the first planar surface; and a second stitching via, electrically connecting any two adjacent conductive portions with each other and in which the two adjacent conductive portions are lined up in a direction that is different from the first direction on the second planar surface.

18 Claims, 13 Drawing Sheets

ELECTROMAGNETIC BANDGAP STRUCTURE AND CIRCUIT BOARD

CROSS-REFERENCE TO RELATED APPLICATIONS

This application claims the benefit of Korean Patent Application No. 10-2008-0120949, filed with the Korean Intellectual Property Office on Dec. 2, 2008, the disclosure of which is incorporated herein by reference in its entirety.

BACKGROUND

1. Technical Field

The present invention relates to an electromagnetic bandgap structure, more specifically to an electromagnetic bandgap structure and a printed circuit board having the same that prevent a signal ranging a predetermined frequency band from being transmitted.

2. Description of the Related Art

New electronic apparatuses and communication apparatuses are increasingly becoming smaller, thinner and lighter, reflecting today's emphasis on growing mobility.

These electronic and communication apparatuses have various complex electronic circuits (i.e. analog circuits and digital circuits) for performing their functions and operations. These electronic circuits typically carry out their functions by being implemented in a printed circuit board (PCB). The electronic circuits on the PCB commonly have different operation frequencies from one another.

The printed circuit board in which various electronic circuit boards are implemented often has a noise problem, caused by the transfer of an electromagnetic (EM) wave resulted from the operation frequency and its corresponding harmonics components of one electronic circuit to another electronic circuit. The transferred noise can be roughly classified into radiation noise and conduction noise.

The radiation noise can be easily prevented by covering a protective cap on the electronic circuit. However, preventing the conduction noise (refer to the reference numeral 150 of FIG. 1) is not as easy, because the conduction noise is transferred through a signal transfer path inside the board.

The noise problem will be described in more detail with reference to FIG. 1. FIG. 1 is a sectional view showing a printed circuit board including two electronic circuits having different operation frequencies. Although FIG. 1 shows a 4-layered printed circuit board 100, it shall be evident that the printed circuit board can be modified to have a 2, 6 or 8-layered structure.

As shown in FIG. 1, the printed circuit board 100 includes four metal layers 110-1, 110-2, 110-3 and 110-4 (hereinafter, collectively referred to as 110) and dielectric layers 120-1, 120-2 and 120-3 (hereinafter, collectively referred to as 120) interposed between metal layers 110. The top metal layer 110-1 of the printed circuit board 100 is implemented with two electronic circuits 130 and 140 having different operation frequencies (hereinafter, referred to as a first electronic circuit 130 and a second electronic circuit 140, respectively). Here, it is assumed that the two electronic circuits 130 and 140 are digital circuits.

Here, if it is assumed that the metal layer represented by the reference numeral 110-2 is a ground layer and the metal layer represented by the reference numeral 110-3 is a power layer, each ground pin of the first electronic circuit 130 and the second electronic circuit 140 is electrically connected to the metal layer represented by the reference numeral 110-2 and each power pin is electrically connected to the metal layer represented by the reference numeral 110-3. In the printed circuit board 100, every ground layer is also electrically connected to each other through vias. Similarly, every power layer is also electrically connected to each other through vias. As an example, a via 160 electrically connects the metal layers of the reference numerals 110-1, 110-3, and 110-4 as shown in FIG. 1.

At this time, if the first electronic circuit 130 and the second electronic circuit 140 have different operation frequencies, a conductive noise 150 caused by an operation frequency of the first electronic circuit 130 and its harmonics components is transferred to the second electronic circuit 140. This has a disadvantageous effect on the accurate function/operation of the second electronic circuit 140.

With the growing complexity of electronic apparatuses and higher operation frequencies of digital circuits, it is increasingly difficult to solve this conduction noise problem. Especially, the typical bypass capacitor method or decoupling capacitor method for solving the conductive noise problem is no longer adequate, as the electronic apparatuses use a higher frequency band.

Moreover, the aforementioned solutions are not adequate when several active devices and passive devices need to be implemented in a complex wiring board having various types of electronic circuits formed on the same board or in a narrow area such as a system in package (SiP) or when a high frequency band is required for the operation frequency, as in a network board.

Accordingly, an electromagnetic bandgap structure (EBG) is recently receiving attention as a scheme to solve the aforementioned conductive noise. This is for the purpose of blocking a signal ranging a certain frequency band by arranging the EBG having a certain structure in a printed circuit board, and the typical EBG has roughly two, namely a Mushroom type EBG(MT-EBG) and a Planar type EBG(PT-EBG).

A general form of the MT-EBG is illustrated in FIG. 2.

For example, the MT-EBG has the structure in which a plurality of EBG cells (refer to the reference numeral 230 of FIG. 2) having a mushroom form are interposed between two metal layers which function as a power layer and a ground layer. FIG. 2 shows only four EBG cells for the convenience of illustration.

With reference to FIG. 2, the MT-EBG 200 further forms a metal plate 231 between a first metal layer 210 and a second metal layer 220 that function as each one of the ground layer and the power layer, and has a form in which the mushroom type structures 230 connecting the first metal layer 210 and the metal plate 231 through a via 232 are repeatedly arranged. At this time, a first dielectric layer 215 is interposed between the first metal layer 210 and the metal plate 231, and a second dielectric layer 225 is interposed between the metal plate 231 and the second metal layer 220.

Such MT-EBG 200 performs the function as a sort of band stop filter by having the state of which a capacitance component formed by the second metal layer 220, the second dielectric layer 225 and the metal plate 231, and an inductance component formed by the via 232 penetrating the first dielectric layer 215 and connecting the first metal layer 210 and the metal plate 231, are connected in L-C series between the first metal layer 210 and the second layer 220.

However, the largest demerit of this structure is the increase of layers, because it needs at least 3 layers to implement the MT-EBG 200. In this case, not only the manufacturing cost of the PCB increases, but also the design freedom is limited.

On the one hand, PT-EBG is illustrated in FIG. 3.

PT-EBG has a structure in which a plurality of EBG cells (refer to the reference numeral 320-1 of FIG. 3) having a certain pattern are repeatedly arranged through any entire metal layer that functions as each one of the ground layer and the power layer. FIG. 3 also shows only four EBG cells for the convenience of illustration.

With reference to FIG. 3, PT-EBG 300 has a form in which any metal layer 310 and a plurality of metal plates 321-1, 321-2, 321-3 and 321-4, which are placed on another planar surface, are bridged to each other through a certain part of metal plates (the edge end of each metal plate in FIG. 3) by metal branches 322-1, 322-2, 322-3 and 322-4.

At this time, the metal plates 321-1, 321-2, 321-3, and 321-4 having a large size constitute the low impedance area and the metal branches having a small size constitute the high impedance area. Accordingly, PT-EBG performs the function as a band stop filter that can block a noise ranging a certain frequency band through the structure in which the low impedance area and the high impedance area are repeatedly formed in turn.

Although such PT-EBG structure has a merit that is enough to constitute the bandgap structure by using only two layers in contrast to the structure of MT-EBG, there is not only a difficulty in making cells smaller but also a design limit, which makes it hard to apply to various application products because it is formed in a lager area. This is because PT-EBG forms the EBG structure by not utilizing various parameters but using only two impedance components.

As described above, the EBG structures according to the conventional technology, such as the MT-EBG and the PT-EBG, have a limit in adjusting each bandgap frequency band appropriate to the conditions and features that are required for various application products or lower a conductive noise below the intended noise level within a pertinent bandgap frequency band.

Accordingly, the research for the EBG structure being extensively applied to various application products for which the required bandgap frequency bands separately differ, not to mention solving the aforementioned conductive noise problem, is urgently needed.

SUMMARY

Accordingly, the present invention provides an electromagnetic bandgap structure and a printed circuit board having the same that can block a conductive noise of a certain frequency band.

The present invention also provides a printed circuit board that can solve a conductive noise problem through an electromagnetic bandgap structure having a certain structure in the printed circuit board without using a bypass capacitor or a decoupling capacitor.

In addition, the present invention provides an electromagnetic bandgap structure and a printed circuit board having the design flexibility and design freedom appropriate for the printed circuit board and being extensively applied to various application products (for example, an electronic apparatus (e.g. a mobile communication terminal) including an RF circuit and a digital circuit which are placed in the same board, SiP (System in Package), and network board, etc.) by the realization of various bandgap frequency band.

Other problems that the present invention solves will become more apparent through the following description.

An aspect of the present invention provides an electromagnetic bandgap structure that can block a noise of a certain frequency band.

In accordance with an embodiment of the present invention, the electromagnetic bandgap structure can include a plurality of first conductive plates, placed on a first planar surface, in which the plurality of first conductive plates are lined up in a first direction, and a plurality of second conductive plates, placed on a second planar surface and arranged at an area corresponding to an area in which the first conductive plates are disposed, in which the plurality of second conductive plates are lined up in the first direction. The electromagnetic bandgap structure can further include a first stitching via, which electrically connects any two adjacent conductive portions with each other and in which the two adjacent conductive portions are lined up in a direction that is different from the first direction on the first planar surface by having a part of the first stitching via pass through a planar surface that is different from the first planar surface. Here, the two adjacent conductive portions placed on the first planar surface can include at least one of the plurality of first conductive plates. The electromagnetic bandgap structure can further include a second stitching via, which electrically connects any two adjacent conductive portions with each other and in which the two adjacent conductive portions are lined up in a direction that is different from the first direction on the second planar surface by having a part of the second stitching via pass through a planar surface that is different from the second planar surface. Here, the two adjacent conductive portions placed on the second planar surface can include at least one of the plurality of second conductive plates.

In accordance with an embodiment of the present invention, a dielectric layer can be interposed between the first conductive plates and the second conductive plates.

In accordance with an embodiment of the present invention, the first stitching via can include a first via, having an end part being connected to one of the two adjacent conductive portions placed on the first planar surface, a second via, having an end part being connected to the other of the two adjacent conductive portions placed on the first planar surface, and a connection pattern, having one end part being connected to the other end part of the first via and the other end part being connected to the other end part of the second via, in which the connection pattern is placed on the planar surface that is different from the first planar surface.

In accordance with an embodiment of the present invention, the second stitching via can include a first via, having an end part being connected to one of the two adjacent conductive portions placed on the second planar surface, a second via, having an end part being connected to the other of the two adjacent conductive portions placed on the second planar surface, and a connection pattern, having one end part being connected to the other end part of the first via and the other end part being connected to the other end part of the second via, in which the connection pattern is placed on the planar surface that is different from the second planar surface. In accordance with an embodiment of the present invention, if the planar surface through which the part of the first stitching via passes is the second planar surface, a clearance hole can be formed in a portion coinciding with a path through which the first stitching via passes among the conductive portions on the second planar surface in such a way that the conductive portions placed on the second planar surface and the first stitching via are electrically separated from one another.

In accordance with an embodiment of the present invention, if the planar surface through which the part of the second stitching via passes is the first planar surface, a clearance hole can be formed in a portion coinciding with a path through which the second stitching via passes among the conductive portions on the first planar surface in such a way that the conductive portions placed on the first planar surface and the second stitching via are electrically separated from one another.

In accordance with an embodiment of the present invention, the first conductive plates and the second conductive plates can be completely overlapped vertically when viewed from the top.

In accordance with an embodiment of the present invention, the first stitching via or the second stitching via can connect the two conductive portions with each other in a direction that is perpendicular to the first direction.

Another aspect of the present invention provides a printed circuit board in which an electromagnetic bandgap structure is disposed in an area of a noise transferable path between a noise source point and a noise blocking destination point of the printed circuit board.

In accordance with an embodiment of the present invention, the electromagnetic bandgap structure can include a plurality of first conductive plates, placed on a first planar surface, in which the plurality of first conductive plates are lined up in a first direction, and a plurality of second conductive plates, placed on a second planar surface and arranged at an area corresponding to an area in which the first conductive plates are disposed, in which the plurality of second conductive plates are lined up in the first direction. The electromagnetic bandgap structure can further include a first stitching via, which electrically connects any two adjacent conductive portions with each other and in which the two adjacent conductive portions are lined up in a direction that is different from the first direction on the first planar surface by having a part of the first stitching via pass through a planar surface that is different from the first planar surface. Here, the two adjacent conductive portions placed on the first planar surface can include at least one of the plurality of first conductive plates. The electromagnetic bandgap structure can further include a second stitching via, which electrically connects any two adjacent conductive portions with each other and in which the two adjacent conductive portions are lined up in a direction that is different from the first direction on the second planar surface by having a part of the second stitching via pass through a planar surface that is different from the second planar surface. Here, the two adjacent conductive portions placed on the second planar surface can include at least one of the plurality of second conductive plates.

In accordance with an embodiment of the present invention, if the planar surface through which the part of the first stitching via passes is the second planar surface, a clearance hole can be formed in a portion coinciding with a path through which the first stitching via passes among the conductive portions on the second planar surface in such a way that the conductive portions placed on the second planar surface and the first stitching via are electrically separated from one another.

In accordance with an embodiment of the present invention, if the planar surface through which the part of the second stitching via passes is the first planar surface, a clearance hole can be formed in a portion coinciding with a path through which the second stitching via passes among the conductive portions on the first planar surface in such a way that the conductive portions placed on the first planar surface and the second stitching via are electrically separated from one another.

In accordance with an embodiment of the present invention, the first conductive plates and the second conductive plates can be completely overlapped vertically when viewed from the top.

In accordance with an embodiment of the present invention, the first direction can be determined to be a direction crossing the noise transferable path, and the first stitching via or the second stitching via can connect the two conductive portions with each other in a direction that is perpendicular to the first direction.

In accordance with an embodiment of the present invention, the first conductive plates can be electrically connected to one of a ground layer and a power layer, and the second conductive plates can be electrically connected to the other of the ground layer and the power layer.

In accordance with an embodiment of the present invention, the first conductive plates can be electrically connected to one of a ground layer and a signal layer, and the second conductive plates can be electrically connected to the other of the ground layer and the signal layer.

In accordance with an embodiment of the present invention, the printed circuit board can further include a pair of conductive planes, which are separated by a portion in which the first conductive plates are disposed on the first planar surface, and the conductive planes and the first conductive plates adjacent to the conductive planes can be electrically connected to each other by the first stitching via. Here, the two conductive planes can correspond to the noise source point and the noise blocking destination point, respectively.

In accordance with an embodiment of the present invention, the printed circuit board can further include a pair of conductive planes, which are separated by a portion in which the second conductive plates are disposed on the second planar surface, and the conductive planes and the second conductive plates adjacent to the conductive planes can be electrically connected to each other by the second stitching via. Here, the two conductive planes can correspond to the noise source point and the noise blocking destination point, respectively.

In accordance with an embodiment of the present invention, if two electronic circuits having different operation frequencies are installed in the printed circuit board, the noise source point and the noise blocking destination point can correspond to one position and the other position, respectively, on the printed circuit board in which the two electric circuits are to be installed.

Additional aspects and advantages of the present invention will be set forth in part in the description which follows, and in part will be obvious from the description, or may be learned by practice of the invention.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Throughout the description of the present invention, when describing a certain technology is determined to evade the point of the present invention, the pertinent detailed description will be omitted. Terms such as "first" and "second" are used only to distinguish one element from the other.

Hereinafter, some examples of an electromagnetic bandgap structure including a stitching via having a basic principle similar to a blocking noise principle in accordance with some embodiments of the present invention will be described with reference to FIG. 4A and FIG. 4B for easy understanding of the present invention before an electromagnetic bandgap structure and a printed circuit board having the same are described with reference to FIG. 6 and FIG. 7.

Although a metal layer, a metal plate and a metal trace are used throughout the description of an electromagnetic bandgap structure of the present invention, it shall be evidently understood by any person of ordinary skill in the art that any other conductive layers, plates and traces can be substituted for the metal layer, the metal plate and the metal trace.

Figure 4A:
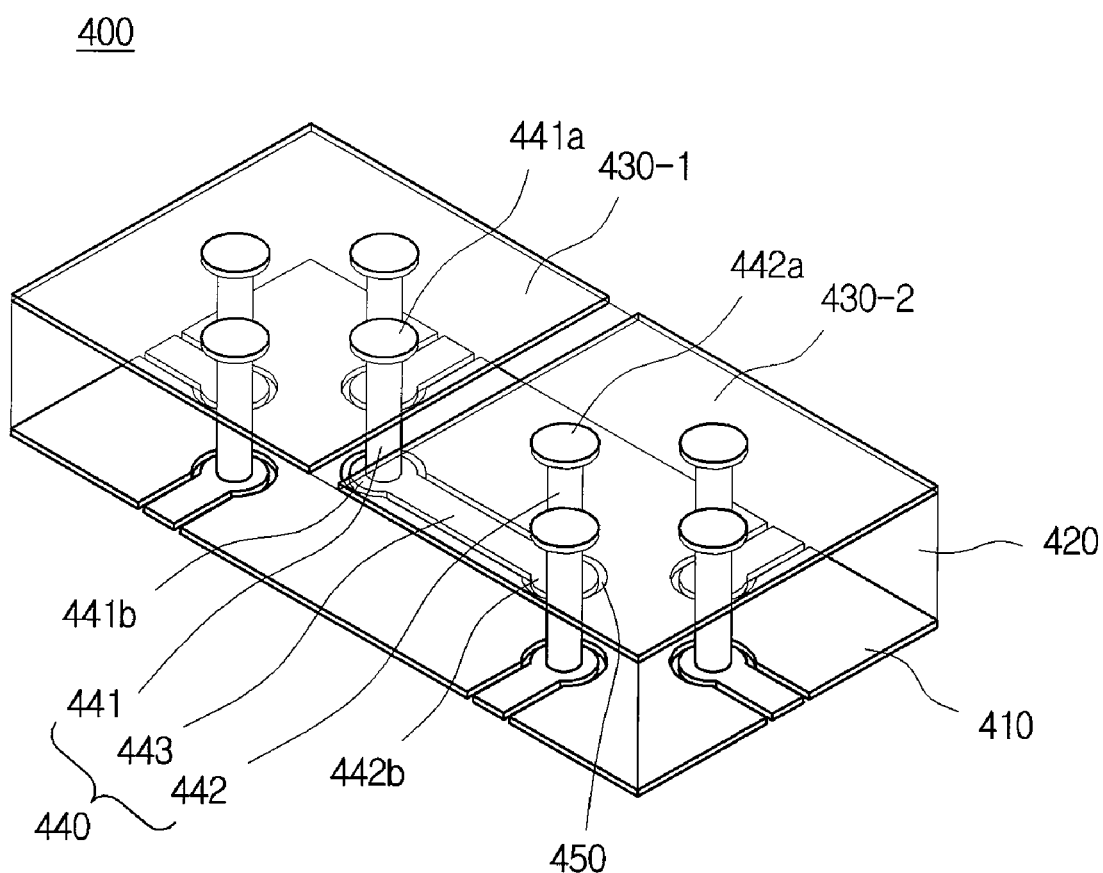
FIG. 4A is a 3-D perspective view showing an electromagnetic bandgap structure including a stitching via having a block principle similar to the present invention.
Figure 5A:
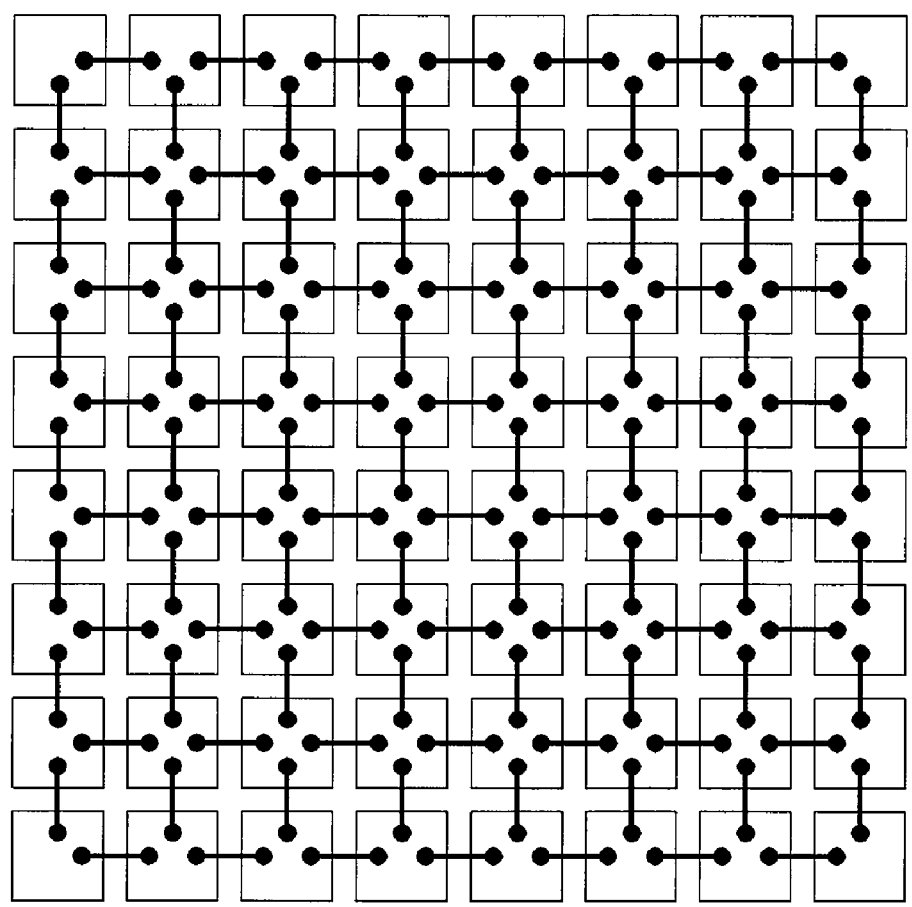
FIG. 5A is a plan view showing a configuration of an electromagnetic bandgap structure including a stitching via having a rectangular metal plate.
Figure 5B:
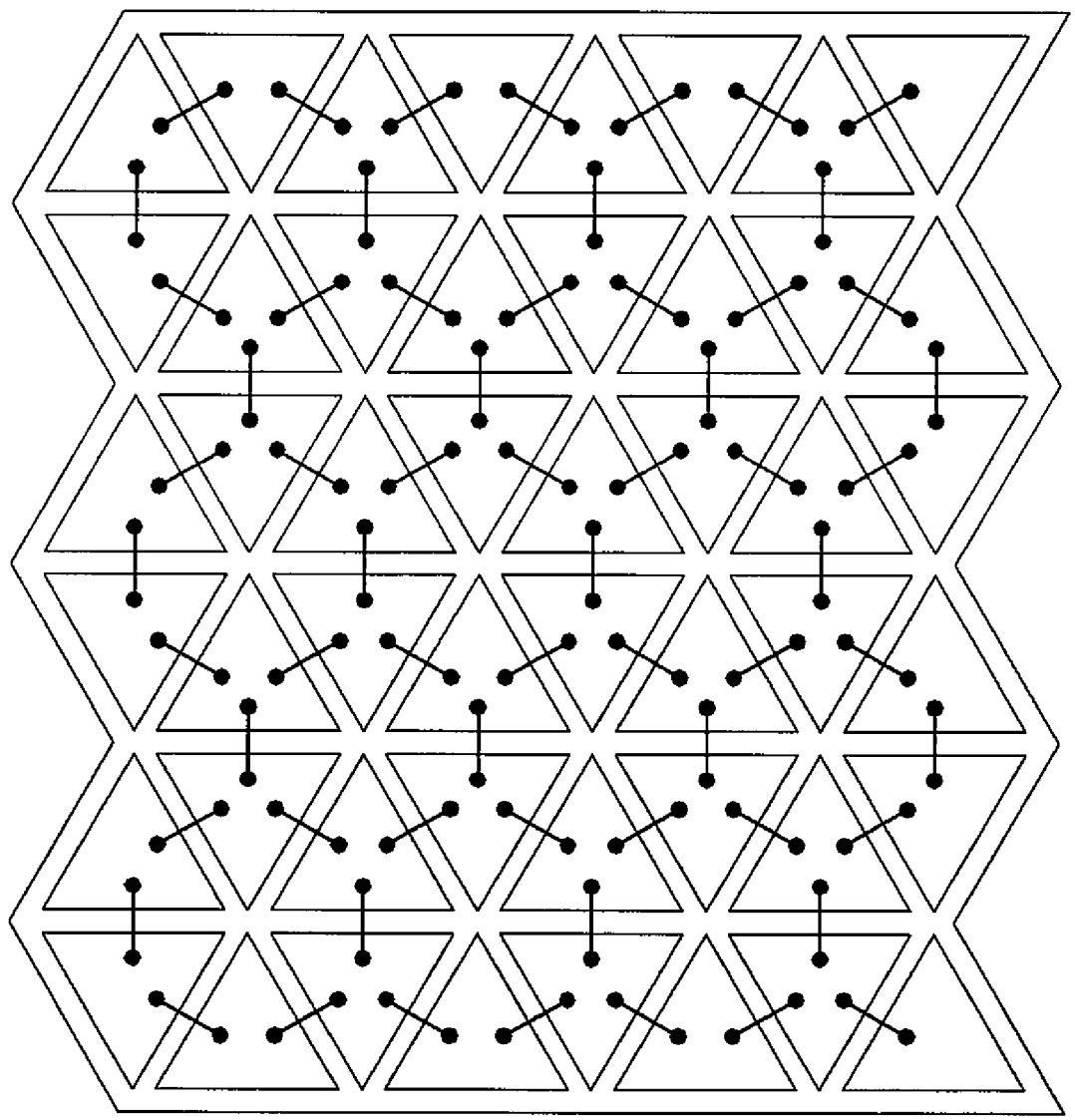
FIG. 5B is a plan view showing a configuration of an electromagnetic bandgap structure including a stitching via having a triangular metal plate.
Figure 5C:
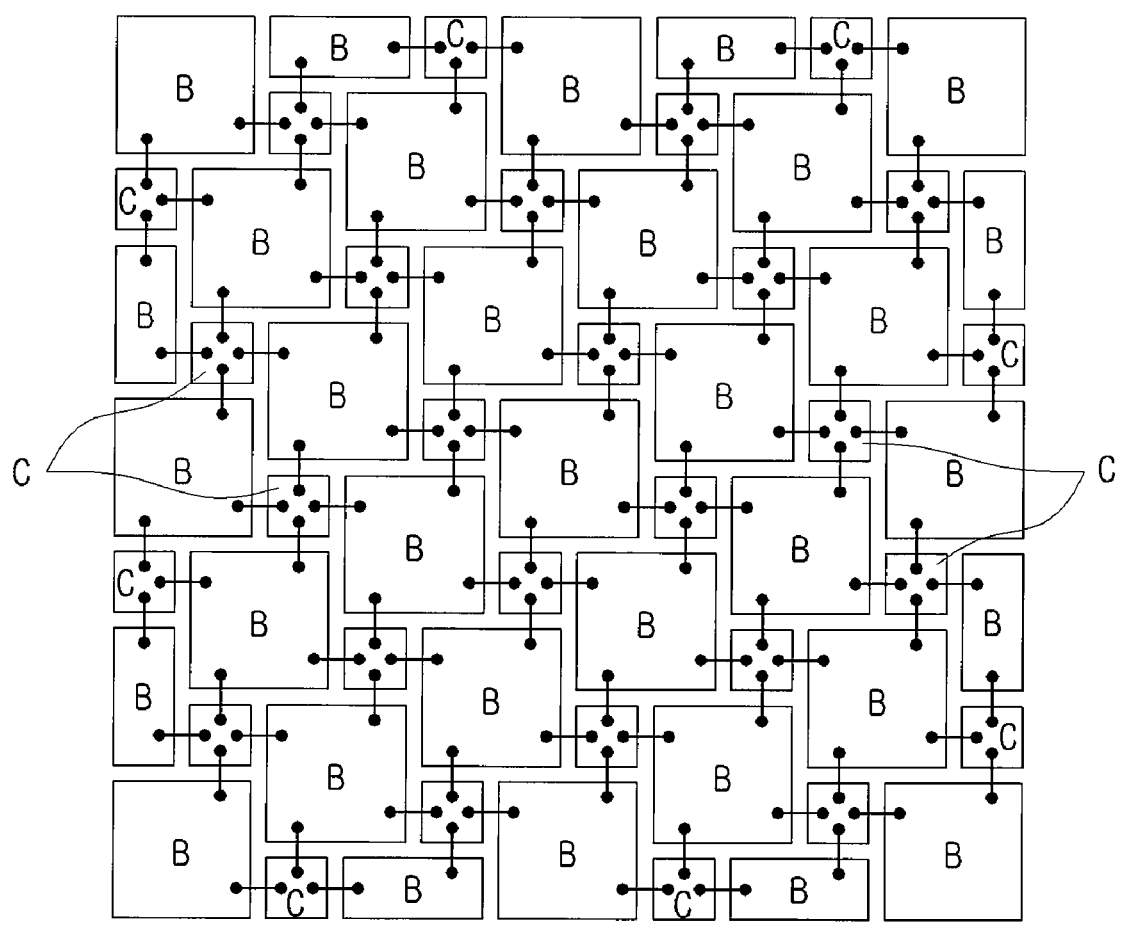
FIG. 5C and FIG. 5D are plan views showing a configuration of an electromagnetic bandgap structure including a stitching via consisting of a plurality of groups having different sized metal plates.
Figure 5D:
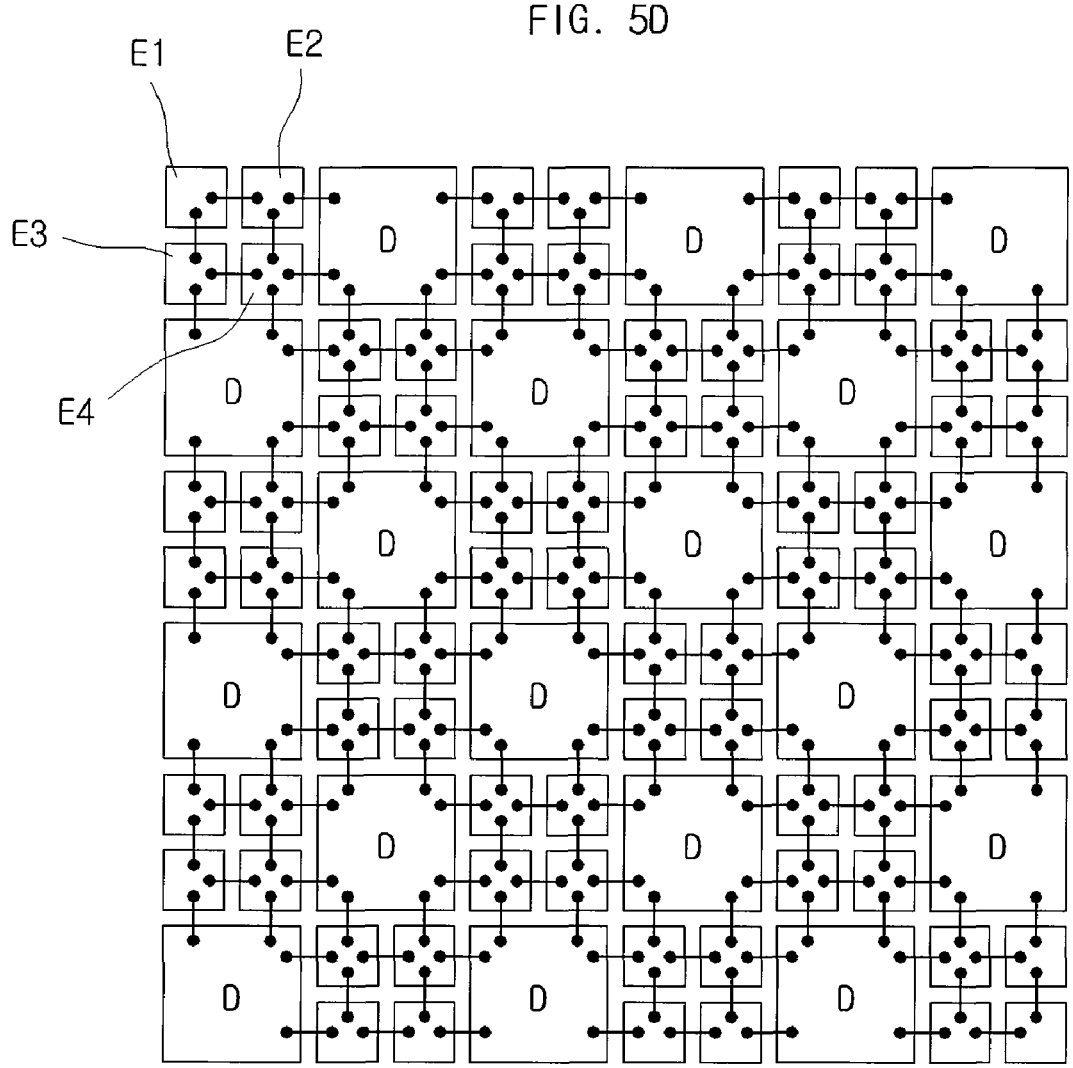
Figure 5E:
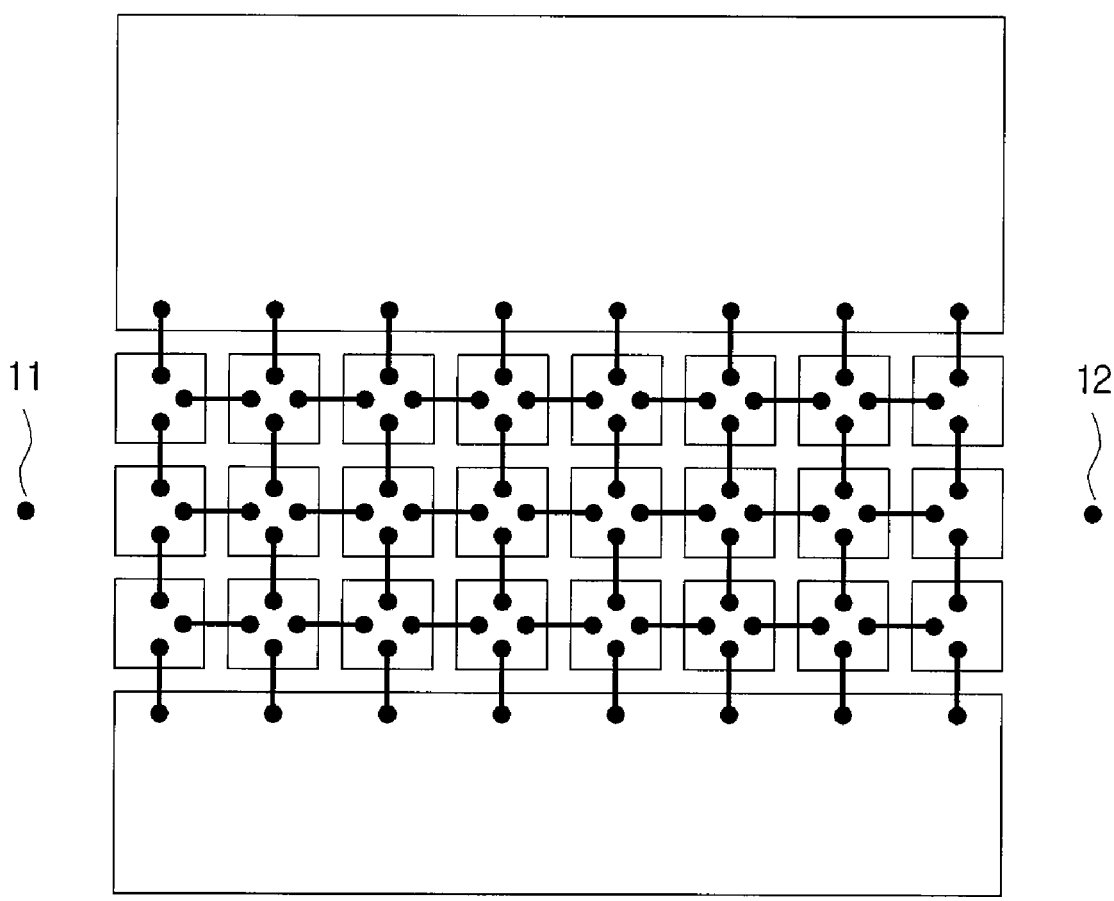
FIG. 5E is a plan view showing a band-shaped configuration of an electromagnetic bandgap structure including a stitching via.
Figure 6:
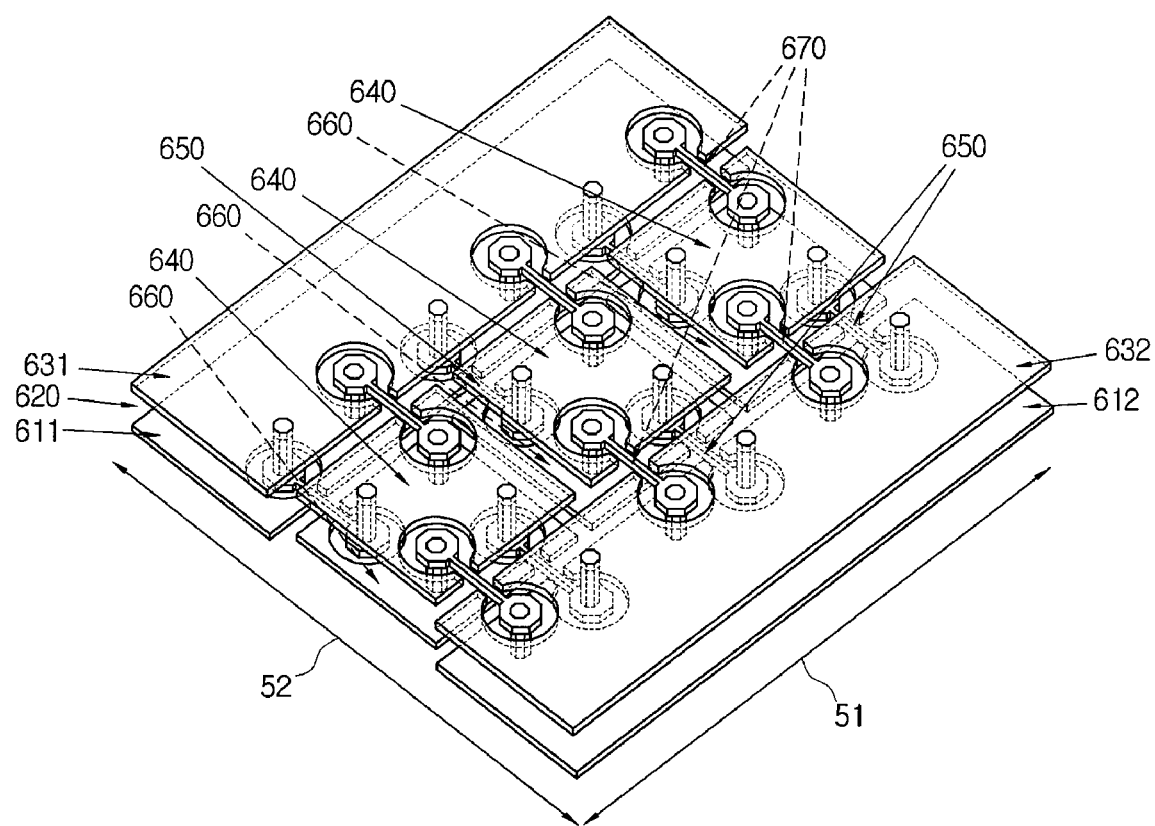
FIG. 6 is a 3-D perspective view showing an electromagnetic bandgap structure having a stand-alone type double plate structure in accordance with an embodiment of the present invention.
Figure 7:
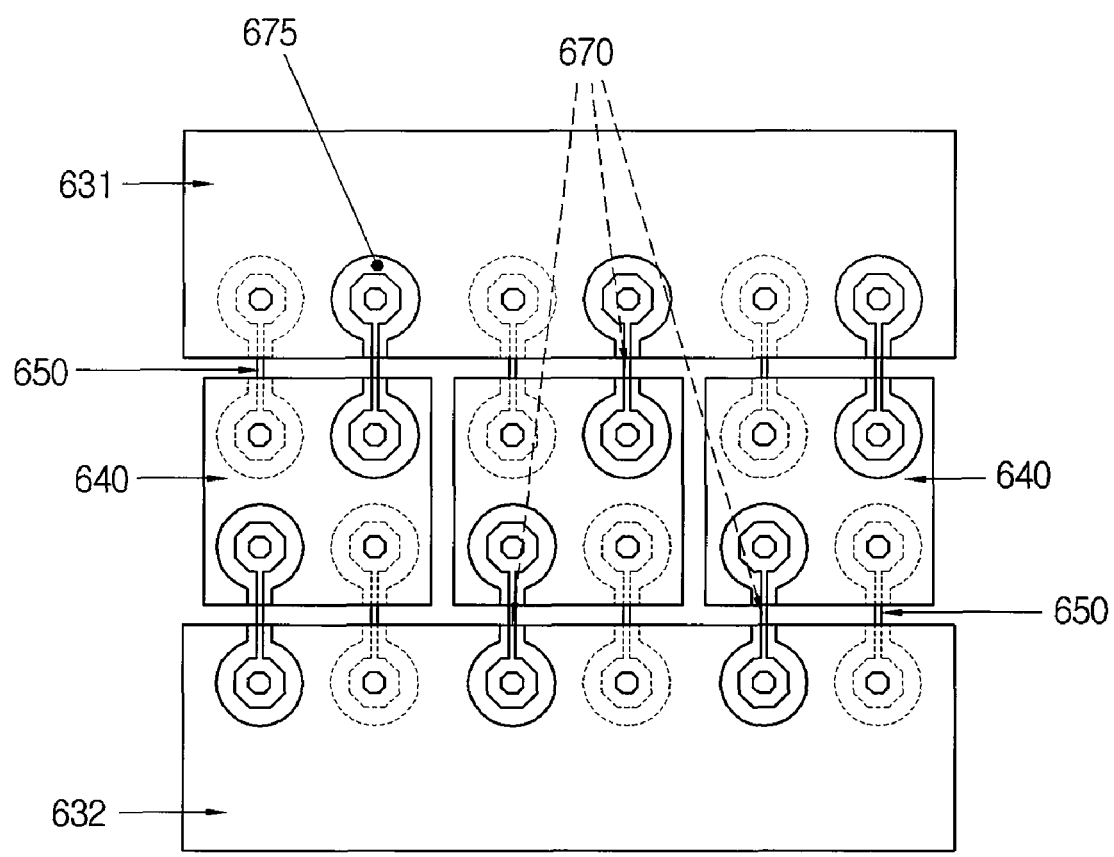
FIG. 7 is a plan view of the electromagnetic bandgap structure shown in FIG. 6 when viewed from the top.

Also, even though FIG. 4A, FIG. 6 and FIG. 7 show only two or three metal plates for the convenience of illustration, the electromagnetic bandgap structure can have a plurality of metal plates repeatedly arranged as its elements as shown in FIG. 5A through FIG. 5E.

An electromagnetic bandgap structure 400 shown in FIG. 4A can include a metal layer 410, a plurality of metal plates 430-1 and 430-2 (hereinafter, referred to as a first metal plate 430-1 and a second metal plate 430-2) spaced from the metal layer 410 and a stitching via 440. The electromagnetic bandgap structure 400 of FIG. 4A can have 2-layered planar structure including a first layer that can consist of the metal layer 410 and a second layer that can consist of the plurality of metal plates 430-1 and 430-2. A dielectric layer 420 can be interposed between the metal layer 410 and the plurality of metal plates 430-1 and 430-2.

Here, FIG. 4A shows only elements constituting the electromagnetic bandgap structure (i.e. the only part constituting the 2-layered electromagnetic bandgap including the stitching via) for the convenience of illustration. Accordingly, the metal layer 410, and the plurality of metal plates 430-1 and 430-2 shown in FIG. 4A may be any two layers of a multi-layered printed circuit board. In other words, it shall be evident that there can be at least one additional metal layer below the metal layer 410, above the metal plates 430-1 and 430-2 and/or between the metal layer 410 and the metal plates 430-1 and 430-2. Similarly, this can be applied to the present invention shown in FIG. 6.

In addition, the electromagnetic bandgap structure 400 shown in FIG. 4A (the same can be applied to the present invention shown in FIG. 6) can be placed between any two metal layers separately constituting the power layer and the ground layer in order to block a conductive noise. Since the conductive noise problem is not limited to the space between the power layer and the ground layer, the electromagnetic bandgap structure shown in FIG. 4A can be placed between any two ground layers or power layers placed on different layers from each other in a multi-layered printed circuit board.

Accordingly, the metal layer 410 may be any one metal layer for transferring an electric signal in a printed circuit board. The metal layer 410, for example, can be any metal layer functioning as the power layer or the ground layer, or any metal layer functioning as a signal layer constituting a signal line.

The metal layer 410 can be placed on a planar surface different from the planar surface in which the plurality of metal plates are placed and electrically separated from the plurality of metal plates. In other words, the metal layer 410 can form a layer that is different from the plurality of metal plates 430-1 and 430-2 with regard to electrical signals in the printed circuit board. For example, if the metal layer 410 is the power layer, the metal plates can be electrically connected to the ground layer. If the metal layer 410 is the ground layer, the metal plates can be electrically connected to the power layer. Alternatively, if the metal layer 410 is the signal layer, the metal plates can be electrically connected to the ground layer. If the metal layer 410 is the ground layer, the metal plates can be electrically connected to the signal layer. Similarly, this can be applied to FIG. 6.

The plurality of metal plates 430-1 and 430-2 can be placed on a planar surface above the metal layer 410. Any two metal plates can be electrically connected to each other through a stitching via. As such, each stitching via electrically connecting any two metal plates to each other can electrically connect every metal plate as one circuit.

Here, FIG. 4A shows the form (i.e. the form of FIG. 5A) that a metal plate and its adjacent metal plates can be electrically connected to each other through one stitching via each, and as a result, every metal plate can be electrically connected to each other. However, as long all metal plates can be formed as a closed loop by being electrically connected to each other, it can be possible to use any method of connecting the metal plates to each other through the stitching via.

Also, even though FIG. 4A shows each of metal plates having a square shape of the same size for the convenience of illustration, various other modifications can be possible (the same can be applied to FIG. 6). This will be briefly described with reference to FIG. 5A through FIG. 5E.

For example, the metal plates can have various polygonal shapes including not only a rectangle as shown in FIG. 5A, and a triangle as shown in FIG. 5B, but also a hexagon, an octagon, etc. Of course, the metal plate may not be limited to a certain shape such as a circle or an ellipse. Each of the metal plates can also have the same size (e.g. area and thickness) as shown in FIG. 5A, FIG. 5B and FIG. 5E. If the metal plates have different sizes, the metal plates can be distinguished and placed according to each of a plurality of groups having different sizes as shown in FIG. 5C or FIG. 5D.

In the case of FIG. 5C, metal plates B having a relatively bigger size and metal plates C having a relatively smaller size can be alternately arranged. In the case of FIG. 5D, metal plates D having a relatively bigger size and metal plates E1, E2, E3 and E4 having a relatively smaller size can be arranged. The small metal plates E1, E2, E3 and E4 can be grouped in a 2×2 form, and can occupy the area similar to the large metal plate D.

In addition, while the cells of the electromagnetic bandgap structures can be densely arranged on the whole part of an inner surface of the printed circuit board as shown in FIG. 5A through 5D, the cells can be naturally arranged on some paths as shown in FIG. 5E. For example, as shown in FIG. 5E, if it is assumed that a point 11 refers to a noise source point and a point 12 refers to a noise blocking destination point, the cells can be repeatedly arranged in at least one line along a noise transferable path between the noise source point 11 and the noise blocking destination point 12. Alternatively, as shown in FIG. 5E, if it is assumed that a point 21 refers to the noise source point and a point 22 refers to the noise blocking destination point, the cells can be arranged in at least one line to have the shape crossing and blocking a noise transferable path between the noise source point 21 and the noise blocking destination point 22 (i.e. the shape of being shielded by a blocking shield).

Figure 1:
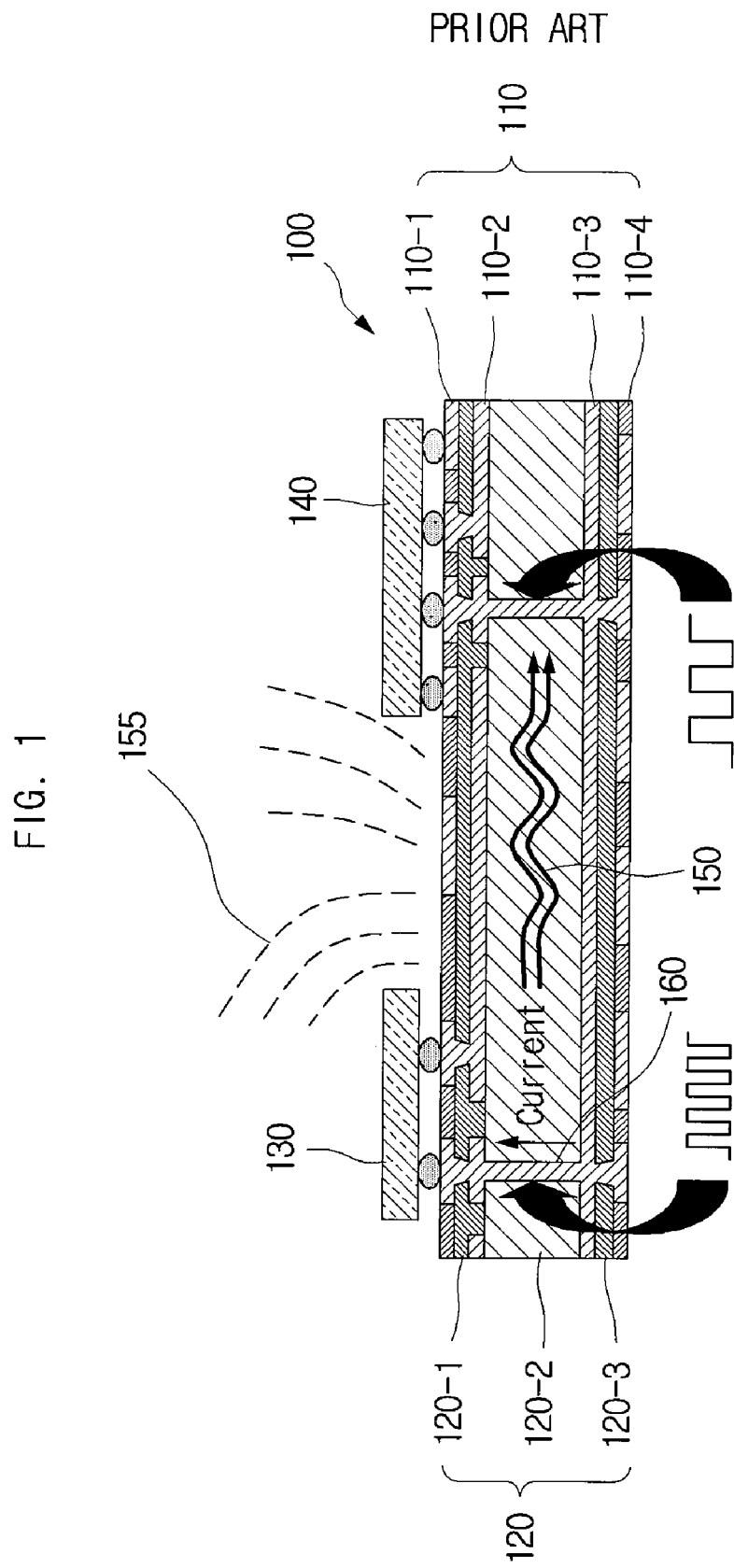
FIG. 1 is a cross-sectional view showing a printed circuit board including two electronic circuits having different operation frequencies.
Figure 2:
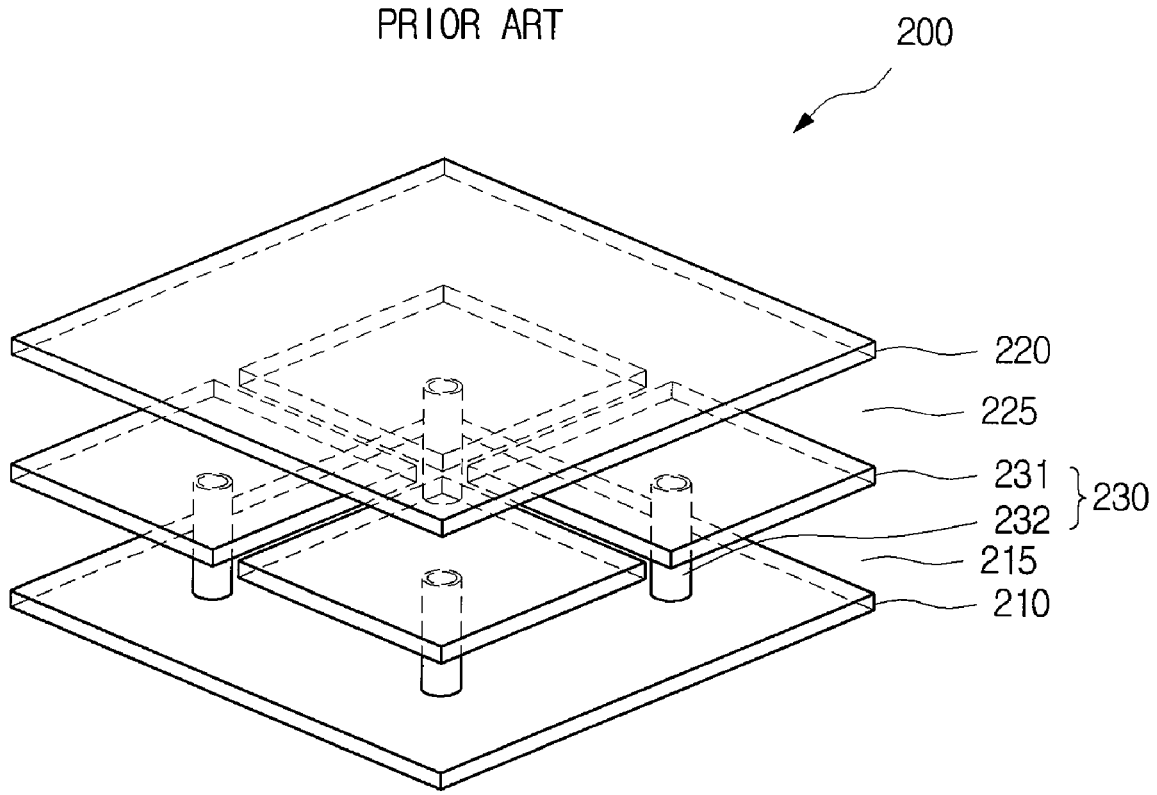
FIG. 2 is a schematic view showing an MT-EBG structure as an electromagnetic bandgap structure in accordance with a conventional art.
Figure 3:
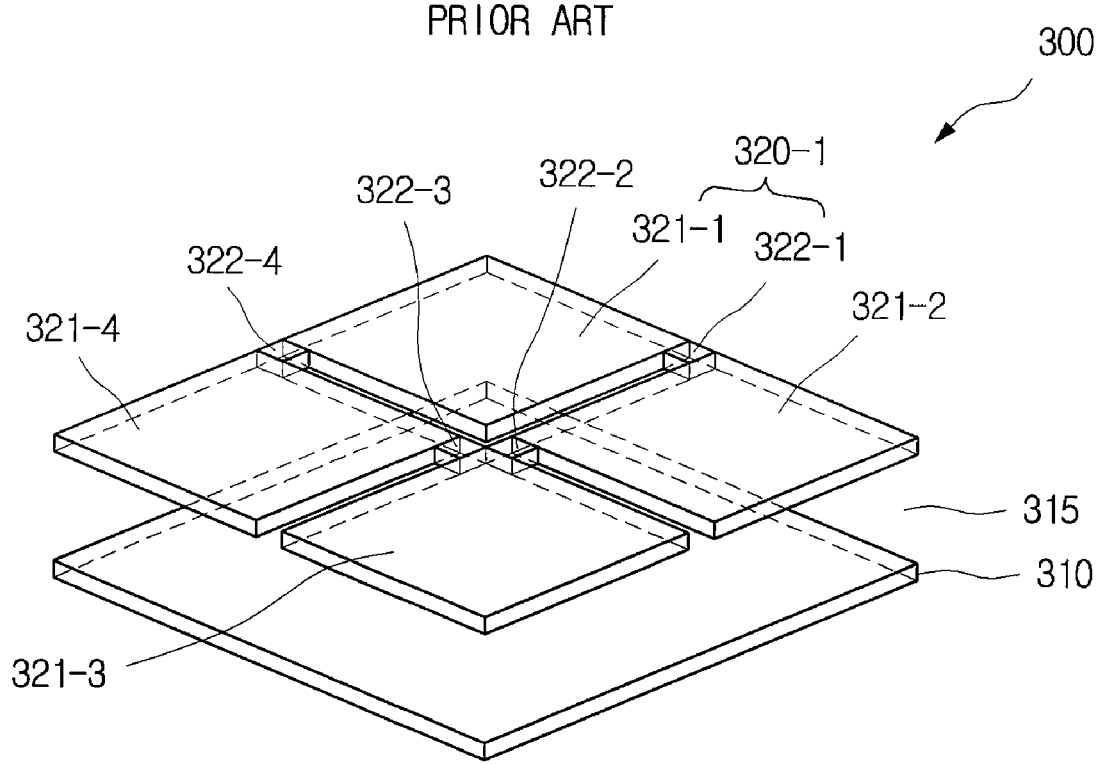
FIG. 3 is a schematic view showing a PT-EBG structure as another example of an electromagnetic bandgap structure in accordance with a conventional art.

Here, if it is assumed that any two electric circuits having different operation frequencies (refer to the first electric circuit 130 and the second electric circuit 140 in FIG. 1, described above) are implemented in the printed circuit board, the noise source point and the noise blocking destination point can correspond to each position in which the two electric circuits will be implemented.

A stitching via can electrically connect any two metal plates of a plurality of metal plates to each other. All accompanying drawings of this specification show that the stitching via electrically connects two adjacent metal plates to each other. However, it may be unnecessary that any two metal plates connected by the stitching via are adjacent to each other. Also, even though it is shown that one metal plate is connected to another metal plate by one stitching via, it is evidently unnecessary that the electromagnetic bandgap structure has any limitation to the number of the stitching vias connecting any two metal plates. However, all below descriptions focus on the case that two adjacent metal plates are connected to each other by one stitching via.

The stitching via 440 can be formed to include a first via 441, a second via 442 and a connection pattern 443 in order to electrically connect two adjacent metal plates.

Herein, the first via 441 can be formed to start from one end part 441a connected to the first metal plate 430-1 and penetrate the dielectric layer 420, and the second via 442 can be formed to start from one end part 442a connected to the second metal plate 430-2 and penetrate the dielectric layer 420. The connection pattern 443 can be placed on the same planar surface as the metal layer 410 and have one end part, connected to the other end part 441b of the first via 441, and the other end part, connected to the other end part 442b of the second via 442. At this time, it is evident that a via land having a larger size than the via can be formed at one end part and the other end part of each via in order to reduce a position error of a drilling process for forming the via. Accordingly, the pertinent detailed description will be omitted.

At this time, a clearance hole 450 can be formed at an edge of the connection pattern 443 of the stitching via 440 in order to prevent the metal plates 430-1 and 430-2 to be electrically connected to the metal layer 410.

The two adjacent metals 430-1 and 430-2 may not be connected on the same planar surface in the electromagnetic bandgap structure of FIG. 4A. Instead, the two adjacent metals 430-1 and 430-2 can be connected to each other through another planar surface (i.e. the same planar surface as the metal layer 410) by the stitching via 440. Accordingly, the electromagnetic bandgap structure 400 having the stitching via 440 of FIG. 4A can more easily acquire an inductance component with a longer length than that of connecting the adjacent metal plates to each other on the same planar surface under the same conditions. In addition, since the adjacent metal plates of the present invention are connected to each other by the stitching via 440, it is unnecessary to form an additional pattern for electrically connecting the metal plates placed on a second layer. This can make a spaced distance between the metal plates narrower. Accordingly, it can be possible to increase the capacitance component formed between the adjacent metal plates.

Described below is the principle by which the structure shown in FIG. 4A can function as the electromagnetic bandgap structure blocking a signal of a certain frequency band. The dielectric layer 420 can be interposed between the metal layer 410 and the metal plates 430-1 and 430-2. This may cause a capacitance component to be formed between the metal layer 410 and the metal plates 430-1 and 430-2 and between the two adjacent metal plates. Also, there may be an inductance component connecting through the first via 441→the connection pattern 443→the second via 442 between the two adjacent metal plates by the stitching via 440. At this time, the value of the capacitance component can vary according to various factors such as the spaced distances between the metal layer 410 and the metal plates 430-1 and 430-2 and between the two adjacent metal plates, the dielectric constant of a dielectric material forming the dielectric layer 420 and the size, shape and area of the metal plate. Also, the value of the inductance component can vary according to various factors such as the shape, length, depth, width and area of the first via 441, a second via 442 and the connection pattern 443. Accordingly, adjusting and designing various aforementioned factors adequately can make it possible to allow the structure of FIG. 4A to function as the electromagnetic bandgap structure (i.e. a band stop filter) for removing or blocking a certain noise or a certain signal of an object frequency band. This can be easily understood through the equivalent circuit of FIG. 4B.

Figure 4B:
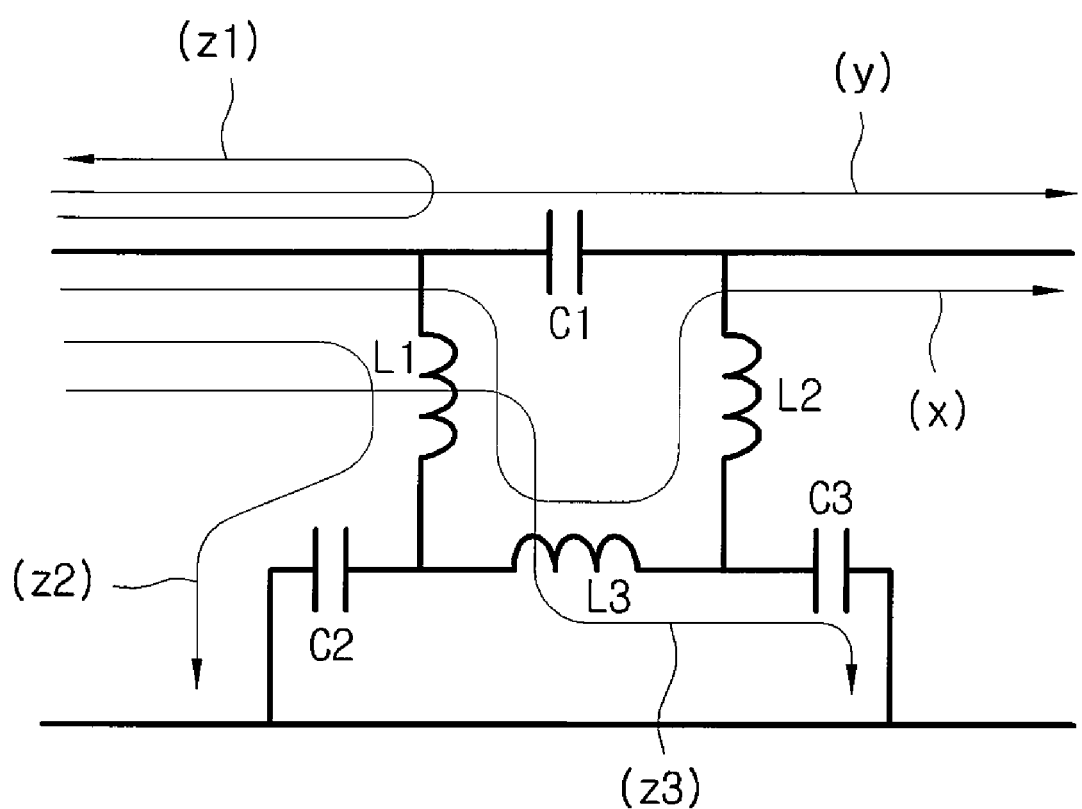
FIG. 4B is a schematic view showing an equivalent circuit of the electromagnetic bandgap structure shown in FIG. 4A.

Comparing the equivalent circuit of FIG. 4B with the electromagnetic bandgap structure of FIG. 4A, an inductance component L1 can correspond to the fist via 441, and an inductance component L2 can correspond to the second via 442. An inductance component L3 can correspond to the connection pattern 443. C1 can be a capacitance component by the metal plates 430-1 and 430-2 and another dielectric layer and another metal layer to be placed above the metal plates 430-1 and 430-2. C2 and C3 can be capacitance components by the metal layer 410 placed on the same planar surface as the connection pattern 443 and another dielectric layer and another metal layer to be placed below the planar surface of the connection pattern 443.

The electromagnetic bandgap structure shown in FIG. 4A can function as a band stop filter, which blocks a signal of a certain frequency band according to the above equivalent circuit. In other words, as seen in the equivalent circuit of FIG. 4B, a signal x of a low frequency band (refer to FIG. 4B) and a signal y of a high frequency band (refer to FIG. 4B) can pass through the electromagnetic bandgap structure, and signals z1, z2 and z3 of a certain frequency band (refer to FIG. 4B) ranging between the low frequency band and the high frequency band are blocked by the electromagnetic bandgap structure.

Accordingly, if the structure of FIG. 4A is repeatedly arranged on a whole part (refer to FIG. 5A. FIG. 5B, FIG. 5C and FIG. 5D) or a part (refer to FIG. 5E) of an inner surface of the printed circuit board (the same can be applied to the structure of FIG. 6 in accordance with an embodiment of the present invention described below) as a noise transferable path, it is possible to function as the electromagnetic bandgap structure that can prevent a signal of a certain frequency band from being transferred.

Hereinafter, the electromagnetic bandgap structure in accordance with an embodiment of the present invention will be described with reference to FIG. 6 and FIG. 7. Below descriptions focus on the difference from the aforementioned electromagnetic bandgap structure, and the description of the content that can be duplicated or be equally applied as described above as shown in FIG. 4A through FIG. 5E (for example, the method of arranging the metal plates, the position of disposition, the method of connection, the detailed configuration of the stitching via, etc.) will be omitted.

The electromagnetic bandgap structure of the present invention has a stand-alone type double plate structure in which metal plates are vertically arranged to overlap with one another. For the purpose of this, as illustrated in FIG. 6 and FIG. 7, the electromagnetic bandgap structure in accordance with an embodiment of the present invention can include a first metal plate 640, a second metal plate 660, a first stitching via 650 and a second stitching via 670. Moreover, a dielectric layer 620 is arranged between the first metal plate 640 and the second metal plate 660. Each of the elements will be described hereinafter.

The first metal plates 640 are arranged in a line parallel to a direction on a planar surface of the printed circuit board. For the convenience of description, the planar surface on which the first metal plates are placed will hereinafter be cited as a first planar surface, and the direction will hereinafter be cited as a first direction (refer to the reference numeral 51 of FIG. 6). Although FIG. 6 and FIG. 7 show only three first metal plates 640 for the convenience of illustration, the electromagnetic bandgap structure of the present invention can have more than three first metal plates as shown in FIG. 5A through FIG. 5D. Also, even though the first metal plates 640 are arranged in a single line between metal planes 631 and 632 as shown in FIG. 6 and FIG. 7, it shall be evident that first metal plates can be arranged in two or more lines as shown in FIG. 5E.

The second metal plates 660 are placed on a planar surface (hereinafter, referred to as a second planar surface) that is different from the first planar surface on which the first metal plates 640 are placed. Although the drawings show only three second metal plates 660 for the convenience of illustration, it shall be apparent that the number of the second metal plates 660 can vary, like the case of the first metal plates 640.

A key feature of the electromagnetic bandgap structure of the present invention is the method of arranging the second metal plates 660 described above. In the present invention, the second metal plates 660 are placed on a planar surface that is different from the first surface, on which the first metal plates 640 are placed, and arranged to correspond to a portion in which the first metal plates 640 are to be arranged. Here, the first metal plates 640 and the second metal plates 660 are arranged in a manner that the first metal plates 640 and the second metal plates 660 are vertically overlapped when viewed from above. This is the double plate structure that is a first feature of the electromagnetic bandgap structure of the present invention.

Although the first metal plates 640 and the second metal plates 660 having the same shape and the same area (size) are completely overlapped vertically with one another as shown in FIG. 6 and FIG. 7, it is not required to have the same double plate structure as that of the present invention. In other words, the first metal plates and the second metal plates can have a different shape or a different area, and/or there are some overlaps between the metal plates by gradually shifting one metal plate to another metal plate.

Furthermore, a second feature of the electromagnetic bandgap structure of the present invention is the stand-alone type structure in which the first metal plates at the top and the second metal plates at the bottom are electrically separated from one another.

In other words, the first metal plates 640 and the second metal plates 660 function as different electric signal layers from one another. For example, if the first metal plate is electrically connected to one of a ground layer and a power layer, the second metal plate can be electrically connected to the other of the ground layer and the power layer, and if the first metal plate is electrically connected to one of the ground layer and a signal layer, the second metal plate can be electrically connected to the other of the ground layer and the signal layer.

As such, the electromagnetic bandgap structure of the present invention having the stand-alone type plate structure is structurally different from the electromagnetic bandgap structure of FIG. 4A, since the metal plates are arranged in a manner that the metal plates at the top and the metal plates at the bottom are vertically overlapped and the metal plates at the top and the bottom are electrically separated from one another.

To connect adjacent metal plates to each other through a stitching via, however, the electromagnetic bandgap structure of the present invention employs a similar connecting method as that of the electromagnetic bandgap structure of FIG. 4A.

Nevertheless, there is a difference between the two connecting methods. In the case of the structure of FIG. 4A, a metal plate is electrically connected to adjacent metal plates surrounding the metal plate through a stitching via, but, in the case of the electromagnetic bandgap structure of the present invention in FIG. 6 and FIG. 7, metal plates lined up in a certain direction (i.e., the first direction 51) are not connected by a stitching via.

However, the reason for this is simply that an excessive number of stitching via connections to the metal plates can lower the degree of freedom and flexibility in design and thus have a disadvantageous effect on the design when reducing the size of the metal plates. Thus, for more lenient design restrictions, such as in cases where the metal plate can be designed with larger sizes in accordance with the applications of the electromagnetic bandgap structure, it shall be apparent that any adjacent metal plates, which are lined up in the first direction of FIG. 6, can also be connected by an additional stitching via.

However, FIG. 6 and FIG. 7 are mainly described in connection with the first stitching via 650 and the second stitching via 670 hereinafter.

The first stitching via 650 electrically connects any two of the adjacent conductive portions lined up in a direction (hereinafter, referred to as a second direction, and, for example, refer to the reference numeral 52 in FIG. 6) that is different from the first direction on the first planar surface. Here, it shall be evident that the first stitching via 650 can electrically connect the two conductive portions to each other on the first planar surface through a planar surface (the second planar surface in the case of FIG. 6) that is different from the first planar surface since this is an inherent structural property of a stitching via.

Here, the conductive portions on the first planar surface include not only the first metal plate 640 but also the two metal planes 631 and 632, which are placed on either side of the first metal plate 640.

As shown in FIG. 6 and FIG. 7, the first metal plates 640 are arranged in a line between the metal planes 631 and 632, and the first metal plate and each of the two metal planes placed on either side of the first metal plate are connected to each other by a first stitching via 650. However, if the first metal plates 640 are arranged in two or more lines along the first direction 51, any two adjacent metal plates of the first metal plates 640 lined up in the second direction 52 can be also connected to each other by the first stitching via 650.

The second stitching via 670 electrically connects any two adjacent conductive portions on the second planar surface by using almost the same connecting method as that of the first stitching via 650, as described above. Like the conductive portions on the first planar surface, the conductive portions on the second planar surface include not only the second metal plate 660 but also two metal planes 611 and 612, which are placed on either side of the second metal plate 640.

As already described above, since the electromagnetic bandgap structure of the present invention has the stand-alone type double plate structure, if the first stitching via 650 passes through the second planar surface, on which the second metal plate 660 and the metal planes 611 and 612 are placed, as shown in FIG. 6 and FIG. 7, it is needed that the first stitching via 660 is not electrically connected with the second metal plate 660 and the metal planes 611 and 612.

Due to the reason described above, a clearance hole can be formed in a portion that coincides with the path through which the first stitching via 650 passes in the second metal plate 660 and the metal planes 611 and 612 placed on either side of the second metal plate 660. Likewise, the same can be applied to the case in which the second stitching via 670 passes through the first planar surface (refer to the reference numeral 675 of FIG. 7).

As described above, the electromagnetic bandgap structure of the present invention has the stand-alone type double plate structure, in which the first metal plates and the second metal plates are placed on different planar surfaces and arranged in a manner that the first metal plates and the second metal plates are overlapped on a corresponding portion. Through such stand-alone type double plate structure, the present invention solves the conductive noise problem.

If it is assumed that one of the two metal planes 631 and 632, which are separated from each other by a portion in which the first metal plates are placed on the first planer surface, corresponds to the noise source point on the printed circuit board and the other corresponds to the noise blocking destination point (the same can be applied to another set of the two metal planes 611 and 612 being separated from each other by a portion in which the second metal plates are placed), a conductive noise being transferred along a path between the noise source point and the noise blocking destination point can be shielded by the electromagnetic bandgap structure having the stand-alone type plate structure interposed between them.

In order to maximize the conductive noise blocking effect, the first direction 51, in which the first metal plates and the second metal plates are arranged, of the present invention can be set to cross a noise transferable path between the noise source point and the noise blocking destination point, and the first stitching vias and the second stitching vias can be set to have the shape following the second direction 52 of FIG. 6 (i.e., the same direction as the noise direction). Moreover, it shall be apparent that an opposite of the method described above or another connecting method can be employed.

Figure 8:
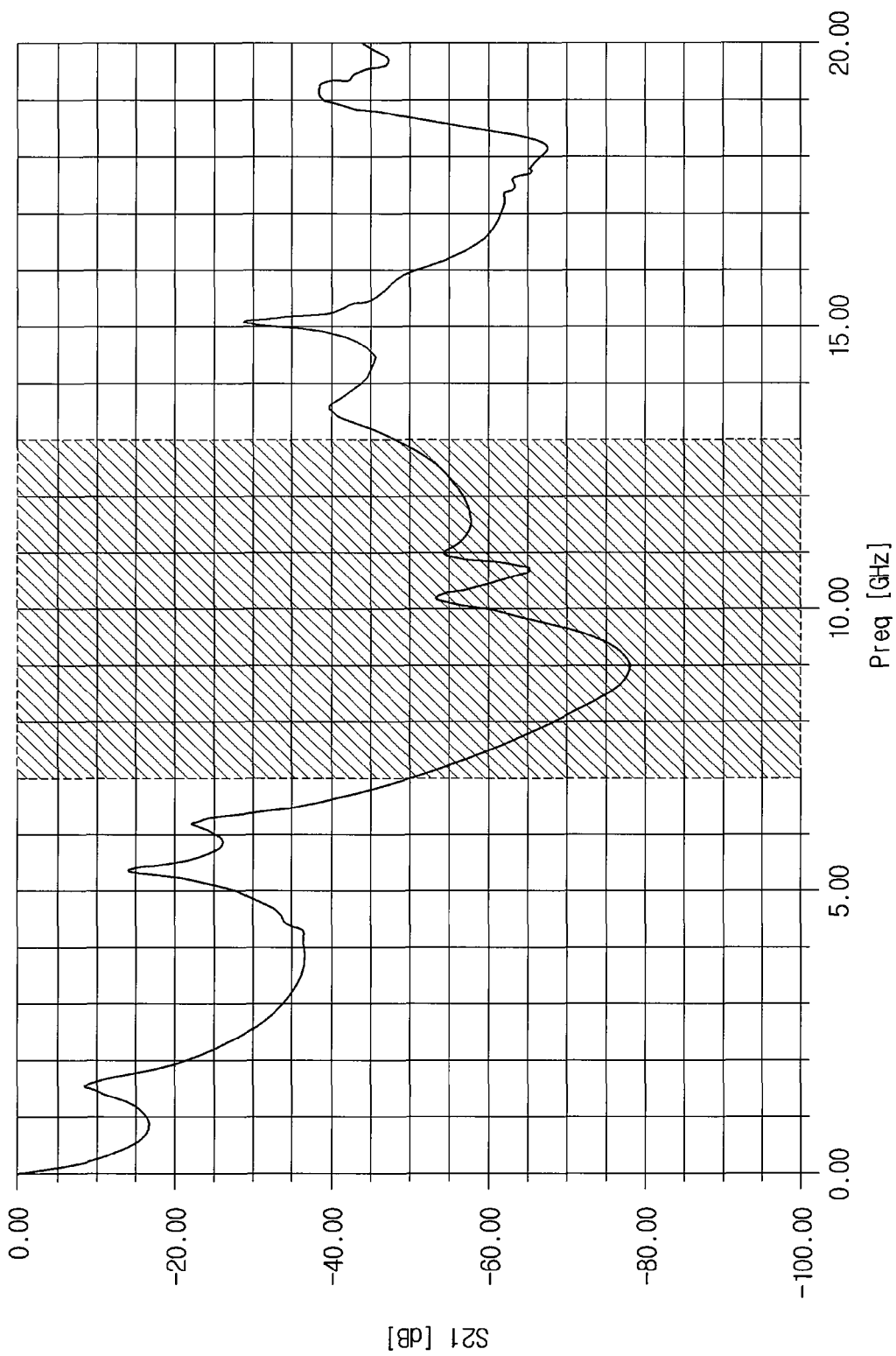
FIG. 8 is a graph showing a bandgap frequency property of the electromagnetic bandgap structure shown in FIG. 6.

FIG. 8 shows a simulation result that is analyzed by scattering parameters in order to check whether an electromagnetic bandgap structure including the stand-alone type double plate structure provided by the present invention has the band stop property of a particular frequency band. With reference to FIG. 8, it can be determined that the electromagnetic bandgap structure having the stand-alone type double plate structure has a high noise isolation effect in the bandgap frequency band formed between about 7 GHz and 13 GHz on a blocking rate of −50 dB basis.

While the spirit of the invention has been described in detail with reference to particular embodiments, the embodiments are for illustrative purposes only and shall not limit the invention. It is to be appreciated that those skilled in the art can change or modify the embodiments without departing from the scope and spirit of the invention. As such, many embodiments other than those set forth above can be found in the appended claims.

What is claimed is:

1. An electromagnetic bandgap structure comprising:
   a plurality of first conductive plates, placed on a first planar surface, the plurality of first conductive plates being lined up in a first direction;
   a plurality of second conductive plates, placed on a second planar surface and arranged at an area corresponding to an area in which the first conductive plates are disposed, the plurality of second conductive plates being lined up in the first direction;
   a first stitching via, configured to electrically connect any two adjacent conductive portions with each other, the two adjacent conductive portions lined up in a direction that is different from the first direction on the first planar surface by having a part of the first stitching via pass through a planar surface that is different from the first planar surface, wherein the two adjacent conductive portions placed on the first planar surface includes at least one of the plurality of first conductive plates; and
   a second stitching via, configured to electrically connect any two adjacent conductive portions with each other, the two adjacent conductive portions lined up in a direction that is different from the first direction on the second planar surface by having a part of the second stitching via pass through a planar surface that is different from the second planar surface, wherein the two adjacent conductive portions placed on the second planar surface includes at least one of the plurality of second conductive plates.

2. The electromagnetic bandgap structure of claim 1, wherein a dielectric layer is interposed between the first conductive plates and the second conductive plates.

3. The electromagnetic bandgap structure of claim 1, wherein the first stitching via comprises:
   a first via, having an end part being connected to one of the two adjacent conductive portions placed on the first planar surface;
   a second via, having an end part being connected to the other of the two adjacent conductive portions placed on the first planar surface; and
   a connection pattern, having one end part being connected to the other end part of the first via and the other end part being connected to the other end part of the second via, the connection pattern being placed on the planar surface that is different from the first planar surface.

4. The electromagnetic bandgap structure of claim 1, wherein the second stitching via comprises:
a first via, having an end part being connected to one of the two adjacent conductive portions placed on the second planar surface;
a second via, having an end part being connected to the other of the two adjacent conductive portions placed on the second planar surface; and
a connection pattern, having one end part being connected to the other end part of the first via and the other end part being connected to the other end part of the second via, the connection pattern being placed on the planar surface that is different from the second planar surface.

5. The electromagnetic bandgap structure of claim 1, wherein the planar surface through which the part of the first stitching via passes is the second planar surface, and a clearance hole is formed in a portion coinciding with a path through which the first stitching via passes among the conductive portions on the second planar surface in such a way that the conductive portions placed on the second planar surface and the first stitching via are electrically separated from one another.

6. The electromagnet bandgap structure of claim 1, wherein the planar surface through which the part of the second stitching via passes is the first planar surface, and a clearance hole is formed in a portion coinciding with a path through which the second stitching via passes among the conductive portions on the first planar surface in such a way that the conductive portions placed on the first planar surface and the second stitching via are electrically separated from one another.

7. The electromagnet bandgap structure of claim 1, wherein the first conductive plates and the second conductive plates are completely overlapped vertically when viewed from the top.

8. The electromagnetic bandgap structure of claim 1, wherein the first stitching via or the second stitching via connects the two conductive portions with each other in a direction that is perpendicular to the first direction in which the plurality of first or second conductive plates are lined up.

9. A printed circuit board in which an electromagnetic bandgap structure is disposed in an area of a noise transferable path between a noise source point and a noise blocking destination point of the printed circuit board, the electromagnetic bandgap structure comprising:
a plurality of first conductive plates, placed on a first planar surface, the plurality of first conductive plates being lined up in a first direction;
a plurality of second conductive plates, placed on a second planar surface and arranged at an area corresponding to an area in which the first conductive plates are disposed, the plurality of second conductive plates being lined up in the first direction;
a first stitching via, configured to electrically connect any two adjacent conductive portions with each other, the two adjacent conductive portions lined up in a direction that is different from the first direction on the first planar surface by having a part of the first stitching via pass through a planar surface that is different from the first planar surface, wherein the two adjacent conductive portions placed on the first planar surface includes at least one of the plurality of first conductive plates; and
a second stitching via, configured to electrically connect any two adjacent conductive portions with each other, the two adjacent conductive portions lined up in a direction that is different from the first direction on the second planar surface by having a part of the second stitching via pass through a planar surface that is different from the second planar surface, wherein the two adjacent conductive portions placed on the second planar surface includes at least one of the plurality of second conductive plates.

10. The printed circuit board of claim 9, wherein the planar surface through which the part of the first stitching via passes is the second planar surface, and a clearance hole is formed in a portion coinciding with a path through which the first stitching via passes among the conductive portions on the second planar surface in such a way that the conductive portions placed on the second planar surface and the first stitching via are electrically separated from one another.

11. The printed circuit board of claim 9, wherein the planar surface through which the part of the second stitching via passes is the first planar surface, and a clearance hole is formed in a portion coinciding with a path through which the second stitching via passes among the conductive portions on the first planar surface in such a way that the conductive portions placed on the first planar surface and the second stitching via are electrically separated from one another.

12. The printed circuit board of claim 9, wherein the first conductive plates and the second conductive plates are completely overlapped vertically when viewed from the top.

13. The printed circuit board of claim 9, wherein the first direction is determined to be a direction crossing the noise transferable path, and the first stitching via or the second stitching via connects the two conductive portions with each other in a direction that is perpendicular to the first direction in which the plurality of first or second conductive plates are lined up.

14. The printed circuit board of claim 9, wherein the first conductive plates are electrically connected to one of a ground layer and a power layer, and the second conductive plates are electrically connected to the other of the ground layer and the power layer.

15. The printed circuit board of claim 9, wherein the first conductive plates are electrically connected to one of a ground layer and a signal layer, and the second conductive plates are electrically connected to the other of the ground layer and the signal layer.

16. The printed circuit board of claim 9, further comprising a pair of conductive planes, separated by a portion in which the first conductive plates are disposed on the first planar surface,
wherein the conductive planes and the first conductive plates adjacent to the conductive planes are electrically connected to each other by the first stitching via, whereas the two conductive planes correspond to the noise source point and the noise blocking destination point, respectively.

17. The printed circuit board of claim 9, further comprising a pair of conductive planes, separated by a portion in which the second conductive plates are disposed on the second planar surface,
wherein the conductive planes and the second conductive plates adjacent to the conductive planes are electrically connected to each other by the second stitching via, whereas the two conductive planes correspond to the noise source point and the noise blocking destination point, respectively.

18. The printed circuit board of claim 9, wherein two electronic circuits having different operation frequencies are patterned on the printed circuit board, and the noise source point and the noise blocking destination point correspond to one position and the other position, respectively, on the printed circuit board on which the two electric circuits are to be patterned.

* * * * *